United States Patent
Aga et al.

(10) Patent No.: US 10,778,236 B2
(45) Date of Patent: Sep. 15, 2020

(54) PLL WITH WIDE FREQUENCY COVERAGE

(71) Applicant: CREDO TECHNOLOGY GROUP LIMITED, Grand Cayman (KY)

(72) Inventors: Arshan Aga, Mountain View (KY); Xiang Gao, San Jose, CA (US); Ni Xu, San Jose, CA (US)

(73) Assignee: Credo Technology Group Limited, Grand Cayman (KY)

( * ) Notice: Subject to any disclaimer, the term of this patent is extended or adjusted under 35 U.S.C. 154(b) by 0 days.

(21) Appl. No.: 16/240,702

(22) Filed: Jan. 4, 2019

(65) Prior Publication Data
US 2020/0220550 A1 Jul. 9, 2020

(51) Int. Cl.
*H03L 7/099* (2006.01)
*H03L 7/197* (2006.01)
*H03L 7/089* (2006.01)
*H03K 19/20* (2006.01)

(52) U.S. Cl.
CPC .......... *H03L 7/1974* (2013.01); *H03L 7/0891* (2013.01); *H03L 7/099* (2013.01); *H03K 19/20* (2013.01)

(58) Field of Classification Search
CPC ..... H03L 7/1974; H03L 7/0891; H03L 7/099; H03K 19/20
See application file for complete search history.

(56) References Cited

U.S. PATENT DOCUMENTS

| 4,686,488 A | 8/1987 | Attenborough |
| 5,768,268 A | 6/1998 | Kline et al. |
| 5,818,416 A * | 10/1998 | Hwang ................. G06T 3/4084 345/667 |
| 6,121,801 A * | 9/2000 | Lee ........................ H03K 23/68 327/115 |
| 6,678,842 B1 | 1/2004 | Shaffer et al. |
| 7,058,150 B2 | 6/2006 | Buchwald et al. |
| 7,088,797 B2 * | 8/2006 | Momtaz ................. H03L 7/183 327/148 |

(Continued)

FOREIGN PATENT DOCUMENTS

CN 104584152 A 4/2015

OTHER PUBLICATIONS

International Search Report and Written Opinion dated Jan. 11, 2018, in PCT/CN17/79880.

(Continued)

*Primary Examiner* — Dinh T Le
(74) *Attorney, Agent, or Firm* — Ramey & Schwaller LLP; Daniel J. Krueger

(57) ABSTRACT

An illustrative PLL circuit and method for generating a clock signal over a wide frequency range without gaps. In one illustrative embodiment, an extended-range PLL includes: a phase comparator that determines a phase error between a reference clock and a feedback clock; a loop filter that converts the phase error into a control signal; a voltage controlled oscillator (VCO) that provides a generated clock signal having a generated clock frequency determined by the control signal; a divide-by-1.5 block that produces a reduced-frequency clock signal in response to the generated clock signal; and a multiplexer that selects one of the generated clock signal and the reduced-frequency clock signal as a selected clock signal.

18 Claims, 6 Drawing Sheets

(56) References Cited

U.S. PATENT DOCUMENTS

| | | | |
|---|---|---|---|
| 7,151,430 B2 | 12/2006 | Mattsson | |
| 7,202,722 B2 * | 4/2007 | Mahadevan | H03K 5/1565 |
| | | | 327/175 |
| 8,058,938 B2 | 11/2011 | Aga et al. | |
| 8,183,971 B2 | 5/2012 | LeGuillou et al. | |
| 8,841,983 B2 | 9/2014 | Newton et al. | |
| 9,008,261 B2 * | 4/2015 | Xiu | G06F 1/08 |
| | | | 377/47 |
| 9,177,709 B2 | 11/2015 | Parthasarathy et al. | |
| 9,385,859 B2 | 7/2016 | Kuan et al. | |
| 9,685,962 B2 * | 6/2017 | Weng | H03L 7/091 |
| 10,313,105 B2 | 6/2019 | Gao et al. | |
| 2007/0246805 A1 | 10/2007 | Ligang et al. | |
| 2012/0044034 A1 | 2/2012 | Nazarian et al. | |
| 2013/0149995 A1 | 6/2013 | Guionnet | |
| 2015/0003505 A1 | 1/2015 | Lusted et al. | |
| 2016/0337114 A1 | 11/2016 | Baden et al. | |

OTHER PUBLICATIONS

Yang, Ching-Yuan; A High Frequency CMOS Multi-Modulus Divider for PLL Frequency Synthesizers; Analog Integr Circ Sig Process; 2008; pp. 155-162; vol. 55; Springer Science-FBusiness Media, LLC.

Non-Final Office Action dated Jan. 24, 2018, in U.S. Appl. No. 15/487,045.

International Search Report and Written Opinion dated May 9, 2017, in International Application No. PCT/CA16/91836.

* cited by examiner

PLL WITH WIDE FREQUENCY COVERAGE

FIELD

The present disclosure relates to a PLL (Phase-Locked Loop) circuit that causes an internal oscillation signal to lock in frequency to an external input clock signal. The disclosure relates specifically to a PLL circuit with wide frequency coverage.

BACKGROUND

Most digital electronic circuits operate in response to a clock signal. In some applications, a number of different integrated circuits (ICs) each require their own clock signal, with all the clock signals derived from and in phase with a reference clock.

One method of accomplishing this is with the use of a phase-locked loop (PLL) circuit, which receives a reference clock and produces an output signal which is in-phase with the reference clock. A conventional PLL circuit 100 is shown in FIG. 1. The PLL circuit 100 comprises a phase frequency detector (PFD) 102, a charge pump and loop filter 103, a voltage control oscillator (VCO) 105, a frequency divider 106 and a post divider 107. A reference clock signal (Refclk) 21 is applied to an input of the phase frequency detector 102, which also receives a divider signal 45 from the frequency divider 106. The PFD 102 produces an error signal 25 indicating the phase difference between the reference signal 21 and the divider signal 45. The error signal 25 is provided to the charge pump and loop filter 103. The charge pump converts this phase difference into positive or negative pulses depending on whether the reference clock signal phase leads or lags the divider signal phase and the loop filter integrates these pulses to generate a control voltage 27, which is provided to VCO 105. The VCO 105 produces an output signal (Pllout) 42 having a frequency which is proportional to control voltage 27, and the output signal 42 is applied to the input of the frequency divider 106. The output signal of frequency divider 106, that is, divider signal 45, is fed back to input of PFD 102.

The frequency at which the phase-locked loop operates is dependent upon the frequency of the reference clock signal 21 and the amount of division by the frequency divider 106. To change frequency of output signal 42 from VCO 105, these elements must be adjusted. Typically, the frequency of output signal 42 is divided by an integer ratio 'N' such that the frequency of output signal 42 is N times of the frequency of the divider signal 45. When the loop is "locked", the control voltage 27 applied by charge pump and loop filter 103 to VCO 105 drives the phase difference between PFD 102 input signals 21 and 45 to zero, such that divider signal 45 has a frequency which is equal to the frequency of reference clock signal 21, and which is in phase with clock signal 21. Output signal 42 is then inputted into a post divider 107 to be divided by 1, 2, 3, 4 or other integer ratio 'M' such that the frequency of the output signal 30 is 1/M times of the frequency of VCO output signal 42.

VCO 105 is conventionally made from a ring oscillator which has a wide output frequency range, as such, it is well-suited for use in PLL circuits which lock to a wide range of desired output frequencies from the same VCO. One drawback to the use of a ring oscillator-based VCO is its relatively high output jitter. In some applications, clock jitter is required to be smaller than a particular value. To lower clock jitter, the circuit's VCO may employ another type of oscillator—such as an LC-tank oscillator—having a superior jitter characteristic, but narrower tuning range.

High-speed serial data signal transmitter/receiver circuitry may include PLL circuitry for producing a clock signal. For multi-data-rate communications protocol support, this PLL may need to operate at a wide range of frequencies that span tens of gigahertz. Post-divider 107 or other circuitry downstream from the PLL is provided for dividing the frequency of the PLL output clock signal by a dynamically selectable factor M. Selectable values of this factor may include 1 and another value such as 2 (or more), which other value is appropriate for modifying the PLL output clock signal frequency to a lower frequency that supports operation of the transmitter at another data rate (not the highest data rate) required by the multi-data-rate communication protocol.

The best high frequency PLL's that offer the best phase noise are made by using LC-tank Voltage Controlled Oscillators. If the design of the VCO is for a very high frequency it is sometimes not possible to have the VCO cover a wide frequency range, e.g., a full octave after accounting for process, temperature, and voltage variations, together with any calibration or compensation mechanisms for mitigating the effects of such variations. (An octave is a frequency range in which the highest frequency is twice the lowest frequency. If an octave is achieved, downstream dividers can be employed to extend the lower end of the frequency range without any gaps or "holes".) Unfortunately, when the maximum frequency output of the PLL is pushed higher, achieving an octave or more of frequency range becomes challenging. Typical ranges can be 1.4-1.8.

If the VCO covers a range of less than 2, then the output signal 30 will have undesirable holes in the frequency range coverage. For instance, if the VCO covers a range of 13.33 GHz-20 GHz, then the output frequencies will be shown in table 1.

TABLE 1

| Post Divider Setting | VCO Frequency Range | Clkout frequency range |
|---|---|---|
| 1 | 13.33 GHz-20 GHz | 13.33 GHz-20 GHz |
| 2 | 13.33 GHz-20 GHz | 6.67 GHz-10 GHz |
| 3 | 13.33 GHz-20 GHz | 4.45 GHz-6.67 GHz |
| 4 | 13.33 GHz-20 GHz | 3.33 GHz-5 GHz |

The frequency range coverage of the VCO is 20 GHz/13.33 GHz=1.5, which is less than 2. As it can be seen from table 1, there are frequency gaps in the output frequency coverage between 10 GHz to 13.33 GHz when post divider setting is changed from 1 to 2, which means that the frequency cannot vary continuously.

SUMMARY

Accordingly, there are disclosed herein an illustrative PLL circuit and method for generating a clock signal over a wide frequency range without gaps. In one illustrative embodiment, an extended-range PLL includes: a phase comparator that determines a phase error between a reference clock and a feedback clock; a loop filter that converts the phase error into a control signal; a voltage controlled oscillator (VCO) that provides a generated clock signal having a generated clock frequency determined by the control signal; a divide-by-1.5 block that produces a reduced-frequency clock signal in response to the generated clock signal; and a multiplexer that selects one of the generated clock signal and the reduced-frequency clock signal as a selected clock signal.

An illustrative embodiment of a clock generation method includes: determining a phase error between a reference clock and a feedback clock; filtering the phase error to yield a control signal; using a voltage-controlled oscillator (VCO) to provide a generated clock signal having a generated clock frequency determined by the control signal; deriving a reduced-frequency clock signal from the generated clock signal with a divide-by-1.5 block; multiplexing a selected one of the generated clock signal and the reduced-frequency clock signal onto a selected clock signal line.

An illustrative embodiment of a divide-by-1.5 circuit block includes: a first divider that produces a first clock signal having a first phase and a first frequency that is one third of the generated clock frequency; a second divider that produces a second clock signal having the first frequency and a second phase that is 180° apart from the first phase; and a combiner that combines the first clock signal with the second clock signal to obtain a combined clock signal having a second frequency that is twice the first frequency.

Each of the foregoing embodiments may be implemented individually or conjointly, together with one or more of the following features in any suitable combination: 1. the divide-by-1.5 block further includes a duty cycle correction circuit that adjusts the combined clock signal to have a 50% duty cycle. 2. the duty cycle correction circuit includes a digital calibration section in series with an analog calibration section. 3. the digital calibration section includes: a delay element that accepts an input clock and produces a delayed clock with a digitally-controlled delay; and a logical OR gate that combines the input clock with the delayed clock to produce a coarsely calibrated clock. 4. the analog calibration section includes: a correction amplifier that produces the reduced-frequency clock signal in response to the coarsely calibrated clock; and a feedback amplifier that adjusts an effective threshold for the correction amplifier to adjust a duty cycle of the reduced-frequency clock signal towards 50%. 5. a controller that adjusts the digitally-controlled delay when the analog calibration section is unable to fully adjust the duty cycle of the reduced frequency clock signal to 50%. 6. a feedback divider that produces the feedback clock in response to the generated clock signal. 7. a feedback divider that produces the feedback clock in response to one of: the reduced-frequency clock signal, and the selected clock signal. 8. a post-divider that converts the selected clock signal into an output clock signal having an output clock frequency that is 1/M of a frequency of the selected clock signal, M being a selectable positive integer. 9. selectable values of M consist only of powers of two. 10. said deriving includes: producing a first clock signal having a first phase and a first frequency that is one third of the generated clock frequency; producing a second clock signal having the first frequency and a second phase that is 180° apart from the first phase; and combining the first clock signal with the second clock signal to obtain a combined clock signal having a second frequency that is twice the first frequency. 11. said deriving further includes adjusting the combined clock signal to have a 50% duty cycle. 12. said adjusting includes: performing a digital calibration on the combined clock signal to produce a coarsely-calibrated clock; and performing an analog calibration on the coarsely-calibrated clock to achieve a 50% duty cycle in the reduced-frequency clock signal. 13. said adjusting further includes: modifying the digital calibration when the analog calibration is unable to fully achieve the 50% duty cycle. 14. applying the generated clock signal to a frequency divider to obtain the feedback clock.

BRIEF DESCRIPTION OF THE DRAWINGS

In order that the manner in which the above-recited and other enhancements and objects of the disclosure are obtained, a more particular description of the disclosure briefly described above will be rendered by reference to specific embodiments thereof which are illustrated in the appended drawings. Understanding that these drawings depict only typical embodiments of the disclosure and are therefore not to be considered limiting of its scope, the disclosure will be described with additional specificity and detail through the use of the accompanying drawings in which.

DETAILED DESCRIPTION

The particulars shown herein are by way of example and for purposes of illustrative discussion of the preferred embodiments of the present disclosure only and are presented in the cause of providing what is believed to be the most useful and readily understood description of the principles and conceptual aspects of various embodiments of the disclosure. In this regard, no attempt is made to show structural details of the disclosure in more detail than is necessary for the fundamental understanding of the disclosure, the description taken with the drawings making apparent to those skilled in the art how the several forms of the disclosure may be embodied in practice.

Figure 1:
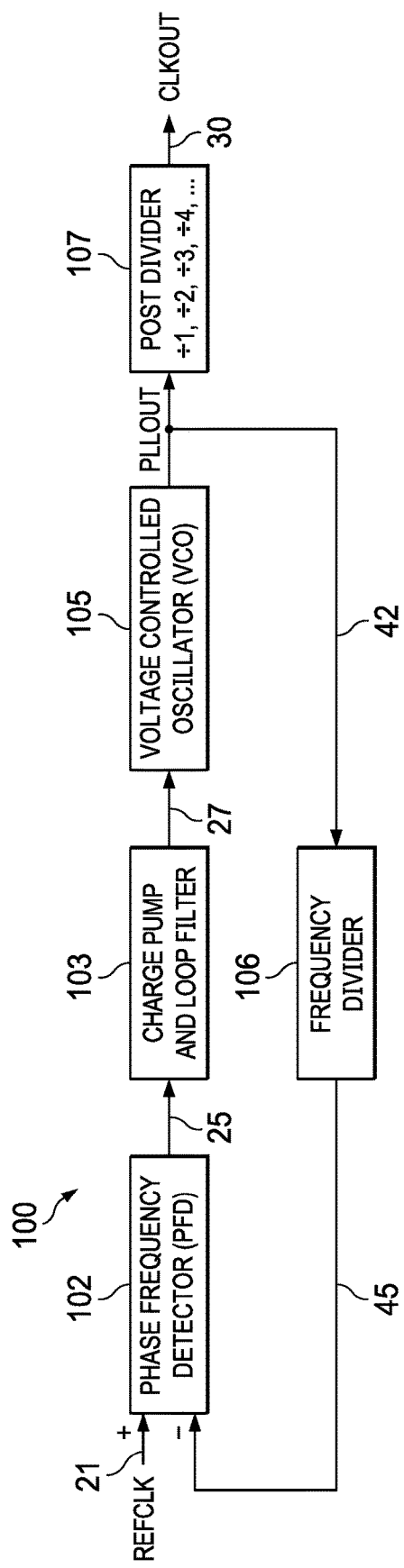
FIG. 1 is a schematic diagram of an illustrative prior art phase locked loop (PLL) frequency synthesizer.
Figure 2:
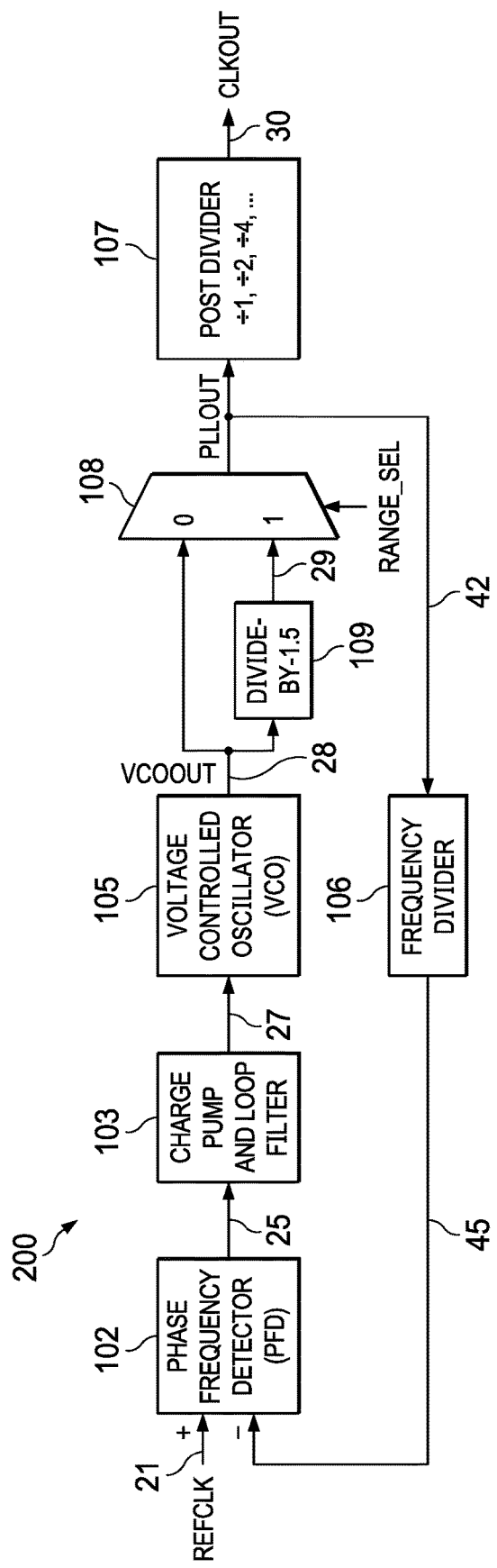
FIG. 2 is a schematic diagram of a PLL frequency synthesizer in accordance with one embodiment of the present disclosure.

FIG. 2 is a block diagram illustrating a constitution of a PLL circuit 200 according to a first embodiment of the present invention. A phase frequency detector 102, a charge pump and loop filter 103, a voltage control oscillator (VCO) 105, a frequency divider 106 and a post divider 107 are the same as shown in the corresponding constituents illustrated in FIG. 1, though now only powers-of-two are employed as divisors. An input clock signal 21 generated by a reference clock generator is provided to the PFD 102, along with a feedback divider signal 45. The PFD 102 produces an error signal 25 that is proportional to the phase/frequency difference between the clock signal 21 and the divider signal 45. The error signal 25 is then converted and filtered by the charge pump and loop filter 103 to produce the input control voltage 27 for the VCO 105. The filter mitigates the effects of the PFD comparison frequency and other spurious frequencies that might otherwise corrupt the spectral purity of the VCO 105.

To the extent that the error signal 25 is positive (indicating that the divider signal phase is lagging that of the reference clock signal), the input control voltage 27 gradually rises, increasing the frequency of the VCO output signal 28 and thereby advancing the phase of the divider signal 45 until the error signal returns to zero. If the error signal 25 is negative, the frequency of the VCO output signal 28 is gradually reduced until the error signal returns to zero. In this fashion, the feedback loop of the PLL forces the error voltage 25 to equal zero, a situation when the output from frequency divider 106 has the same phase as the clock signal 21. When the error voltage 25 has been made equal to zero by the action of the feedback loop, the loop is said to be "locked" to the clock signal 21.

PFD 102, charge pump and loop filter 103 may be implemented in accordance with methods well-known to those familiar with the art. VCO 105 is preferably implemented with a LC-tank oscillator. A LC-tank oscillator is preferred because it offers a jitter characteristic that is better than that provided by other oscillator types, such as a ring oscillator. Though LC-tank oscillators have superior jitter characteristics, they also tend to have relatively narrow output frequency ranges—typically about ±25% around a center frequency. Other VCO's that are not LC-tank based such as ring-oscillator or relaxation oscillator can also be used. As discussed above, if a PLL frequency synthesizer uses a PLL having less than an octave of frequency range, the synthesizer may have gaps in the frequency range coverage.

To extend the PLL range, synthesizer circuit 200 provides a divide by 1.5 block 109 to optionally divide the frequency of output signal 28 by 1.5 before it is output from the PLL. The divide by 1.5 block 109 will be depicted in detail hereafter. The output signal 29 of the block 109 (also refer to as the divided-frequency output of the VCO) and the original output signal 28 of VCO are provided to a multiplexer 108, which selects one of them to be supplied as the PLL output signal 42 to the post divider 107 and the frequency divider 106. The selection of the inputs of the multiplexer 108 is controlled by a range selection signal. When the range selection signal is low, the multiplexer 108 will output the original VCO output signal 28; when the selection signal is high, the multiplexer 108 will output the divided-frequency output signal 29. The range selection signal can be produced by the controller responsible for setting the output frequency range of the PLL synthesizer. The controller can be (or include) any processing circuit that can perform desired functions and calculations for the PLL synthesizer circuit 200, such as micro-processors, programmable devices or circuits, logic gates, etc.

Provided that the divide ratio of the frequency divider 106 is set as 1, the range_sel signal is set as 1, the divide ratio of the post divider 107 is set as M, then the frequency of the output signal 30 is equal to the frequency of VCO output signal 28 divided by 1.5M. But if the range_sel signal is set as 0, the divide ratio of the post divider 107 is set as M, then the frequency of the output signal 30 is equal to the frequency of VCO output signal 28 divided by M. if the VCO covers a range of 13.33 GHz-20 GHz, then utilizing the post divider 107 and the range_sel bit the frequency of the output signal 30 will be shown in table 2.

TABLE 2

| Post Divider Setting | Range_sel | VCO Frequency Range | Clkout frequency range |
|---|---|---|---|
| 1 | 0 | 13.33 GHz-20 GHz | 13.33 GHz-20 GHz |
| 1 | 1 | 13.33 GHz-20 GHz | 8.89 GHz-13.33 GHz |
| 2 | 0 | 13.33 GHz-20 GHz | 6.67 GHz-10 GHz |
| 2 | 1 | 13.33 GHz-20 GHz | 4.45 GHz-6.67 GHz |
| 4 | 0 | 13.33 GHz-20 GHz | 3.33 GHz-5 GHz |
| 4 | 1 | 13.33 GHz-20 GHz | 2.22 GHz-3.33 GHz |

As can be seen from the Table 2, there are no more holes in the range of frequency coverage. Furthermore, because the frequency range of the PLL itself now spans more than an octave, the post divider 107 can be simplified to just have division ratios of 1, 2, 4, 8, 16 (i.e. powers of 2), and would not require any duty cycle correction after the post divider 107 to eliminate odd-even cycle jitter. Note, however, that a duty cycle corrector may still be desired after block 109. A novel duty cycle correction circuit is described in detail further below.

Based on Table 2, a method to set the range select signal can be described as follows: first, determine if the desired PLL synthesizer output frequency is in one of the ranges achievable by the PLL synthesizer with the normal, predetermined, PLL range (i.e., with the range select signal set to "0") together with one of the available integer post-divider ratios. If not, set the range select signal to "1", so that the output of the 1.5 divider block is selected as the PLL output.

Figure 3:
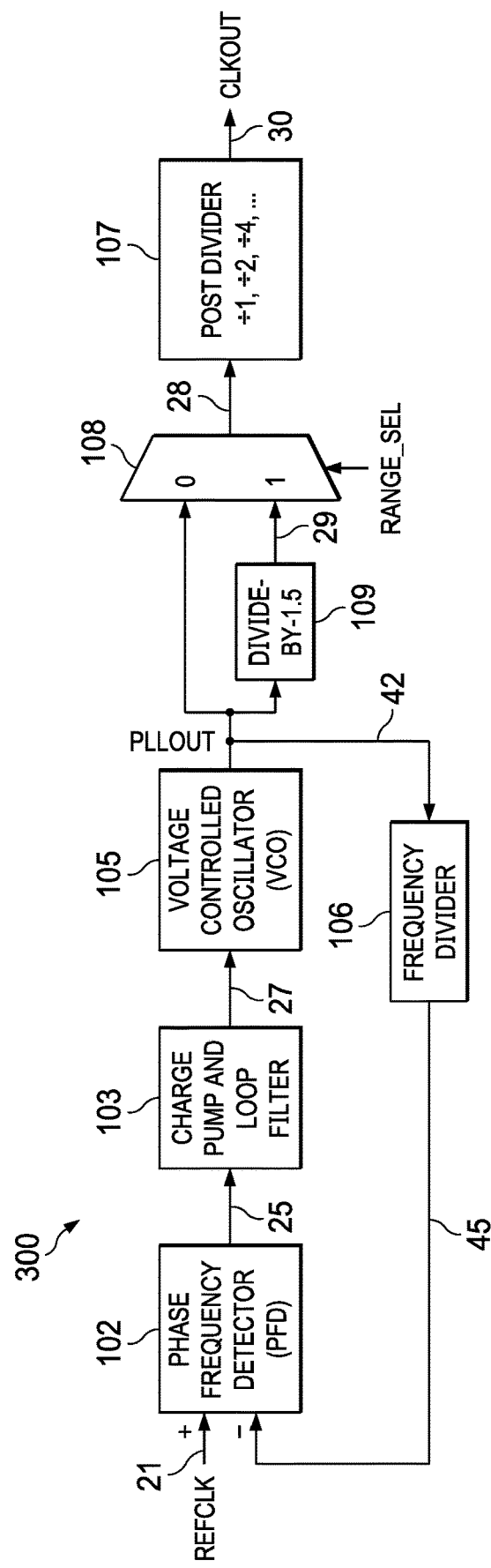
FIG. 3 is a schematic diagram of a PLL frequency synthesizer in accordance with another embodiment of the present disclosure.

FIG. 3 is a block diagram of an alternative embodiment of an illustrative PLL synthesizer circuit 300. The PFD 102, the charge pump and loop filter 103, the VCO 105, the frequency divider 106, the post divider 107, the divide by 1.5 block 109 and the multiplexer 108 are the same as shown in the corresponding constituents illustrated in FIG. 2. The difference between FIG. 2 and FIG. 3 is the feedback signal. In FIG. 2, feedback signal supplied to frequency divider 106 is the output of multiplexer 108; in FIG. 3, feedback signal supplied to frequency divider 106 is the output of VCO 105. As before, if the VCO covers a range of 13.33 GHz-20 GHz, then with the range selection signal and the post divider 107, the frequency of the output signal 30 will vary continuously across the frequency range without any gaps in coverage.

Figure 4:
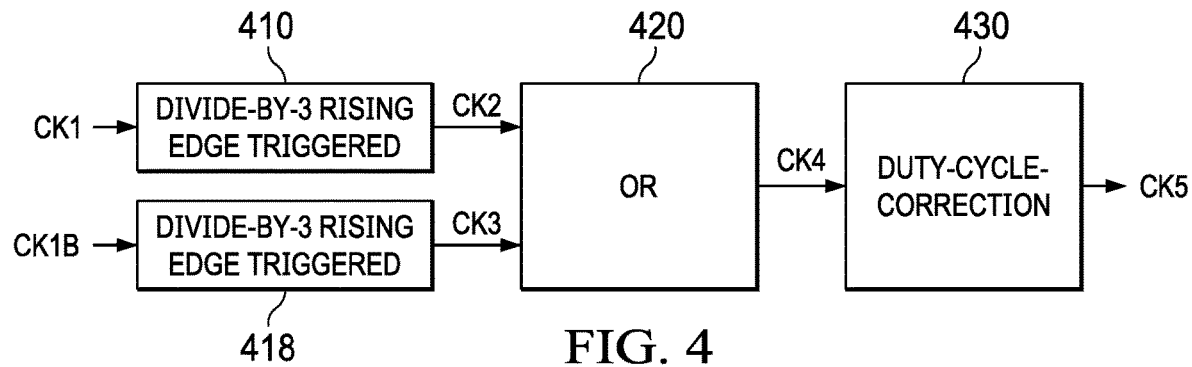
FIG. 4 is a schematic diagram of an illustrative divide-by-1.5 divider.

The implementation of the divide-by-1.5 block can be done in various ways. Referring to FIG. 4, one particular implementation involves two divide-by-3 rising edge triggered blocks 410 and 418, and an OR gate 420 followed by an optional duty cycle correction 430. A differential clock signal, i.e., clock signal CK1 and its complement CK1B, is employed. Signals CK1 and CK1B are supplied to divider blocks 410 and 418 respectively, and the outputs of the divider blocks 410 and 418 (labeled CK2 and CK3) are provided as separate inputs to a logical OR gate 420. In alternative embodiments, OR gate may be replaced with a XOR gate, summation node, or combinational logic or clocked/dynamic logic or other form of signal combiner. The output of OR gate 420 (labeled as CK4) is supplied to the optional duty cycle corrector 430. Duty cycle corrector converts its input signal (CK4) into an output clock signal (CK5) having a 1:1 (i.e., 50%) duty cycle.

Figure 5:
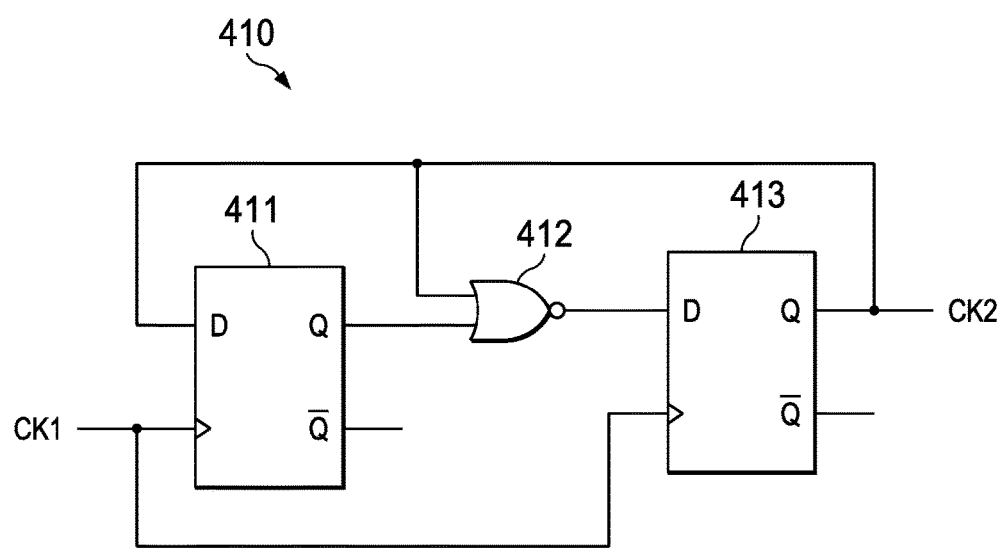
FIG. 5 is a schematic diagram of an illustrative divide-by-3 divider.

FIG. 5 is a block diagram of an illustrative divide-by-3 block 410. The divide-by-3 block 410 comprises two D-type flip-flops 411 and 413, the D inputs of which are referred to here as D1 and D2, the Q outputs of which are referred to here as Q1 and Q2. Q1 and Q2 are provide as separate inputs to a NOR gate 412, and Q2 connects to D1. The output of NOR gate 412 connects to D2. Clock input CK1 drives the clock inputs of both flip-flops 411 and 413.

Figure 6:
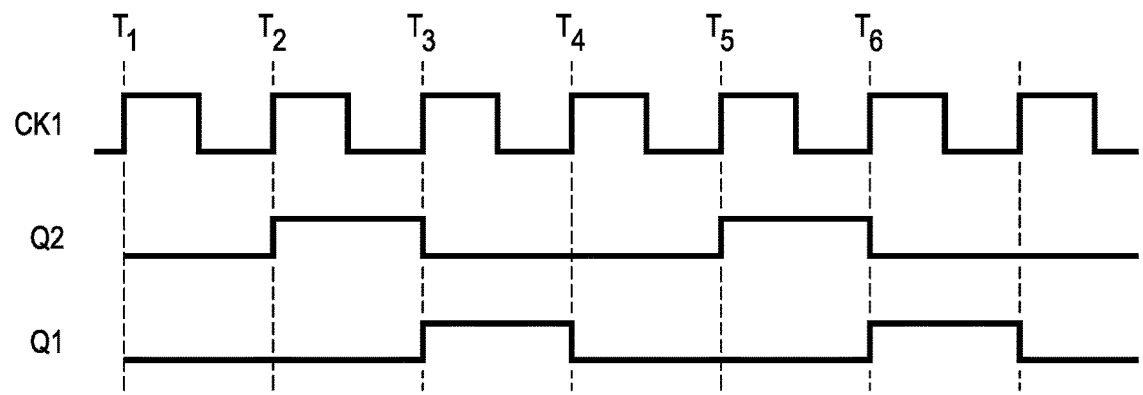
FIG. 6 is a set of waveforms for the illustrative divide-by-3 divider in FIG. 5.

The operation of divide-by-3 block 410 is now explained with reference to FIGS. 5 and 6. Starting at time T1, the output of Q1 and Q2 are low, such that D1=0 and D2=1. At time T2, the clock input CK1 goes high, the value of D will be assigned to the output Q, in this case, Q1=0, Q2=1. Because Q2 connects with D1 and D2 is the output of $\overline{Q1+Q2}$, D1=1 and D2=0 for the next cycle. At time T3, the rising edge of signal CK1 is applied to the clock input of the two flip-flops 411 and 413, and Q1=1, Q2=0. Then D1=0 and D2=1, and at time T4, Q1=0, Q2=0. As both outputs are now low, the cycle begins again at time T5. As can be seen from the FIG. 6, the periods of Q1 and Q2 are three times of the period of the clock input CK1, and thus the frequency of the output CK2 is ⅓ of the frequency of the input CK1.

Figure 7:
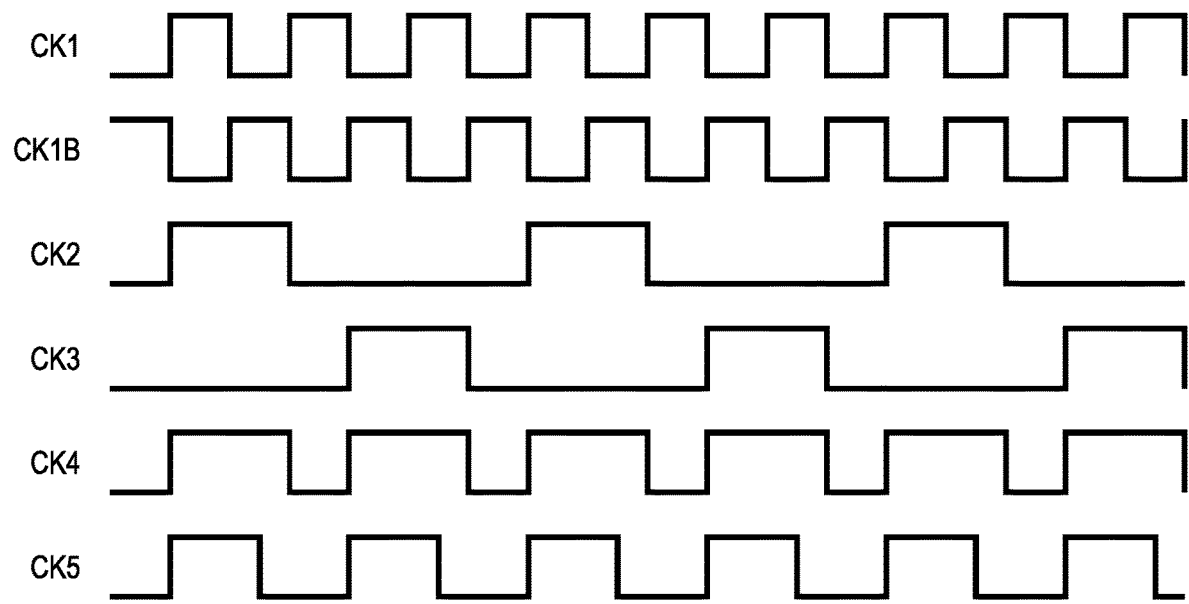
FIG. 7 is a set of waveforms for the illustrative divide-by-1.5 divider in FIG. 4.

The operation of the divide-by-1.5 block in FIG. 4 is now explained with reference to FIG. 7. CK1 and CK1B are complementary signals and have the same frequency. As mentioned above, the frequency of CK2 (the output of block 410) is ⅓ of the frequency of the input CK1, as is the frequency of CK3 (the output of block 418). Blocks 410 and 418 are initialized such that CK2 and CK3 are 180 degrees out of phase, each having a 1:2 (33%) duty cycle. The sum (logical OR) of CK2 and CK3 is signal CK4 at twice the frequency of the input signals, with a duty cycle of 2:1 (67%). Clock signal CK4 may be inverted to provide a 1:2 (33%) duty cycle.

The 50% duty cycle clock is highly recommended in the full data rate communication system. Duty cycle correction (DCC) 430 can operate to convert a 33% duty cycle to a 50% duty cycle. Conventional techniques for implementing duty cycle correction include the use of a resistor-capacitor (RC) circuit to take the average of the high and low values of the clock signal for comparison to one-half the supply voltage, employing a feedback circuit to drive the difference to zero. Although effective, the large capacitive and resistive values employed for averaging may cause relatively slow response times. Further, the feedback circuit typically requires a high-gain amplifier which may be difficult to reliably achieve.

Figure 8:
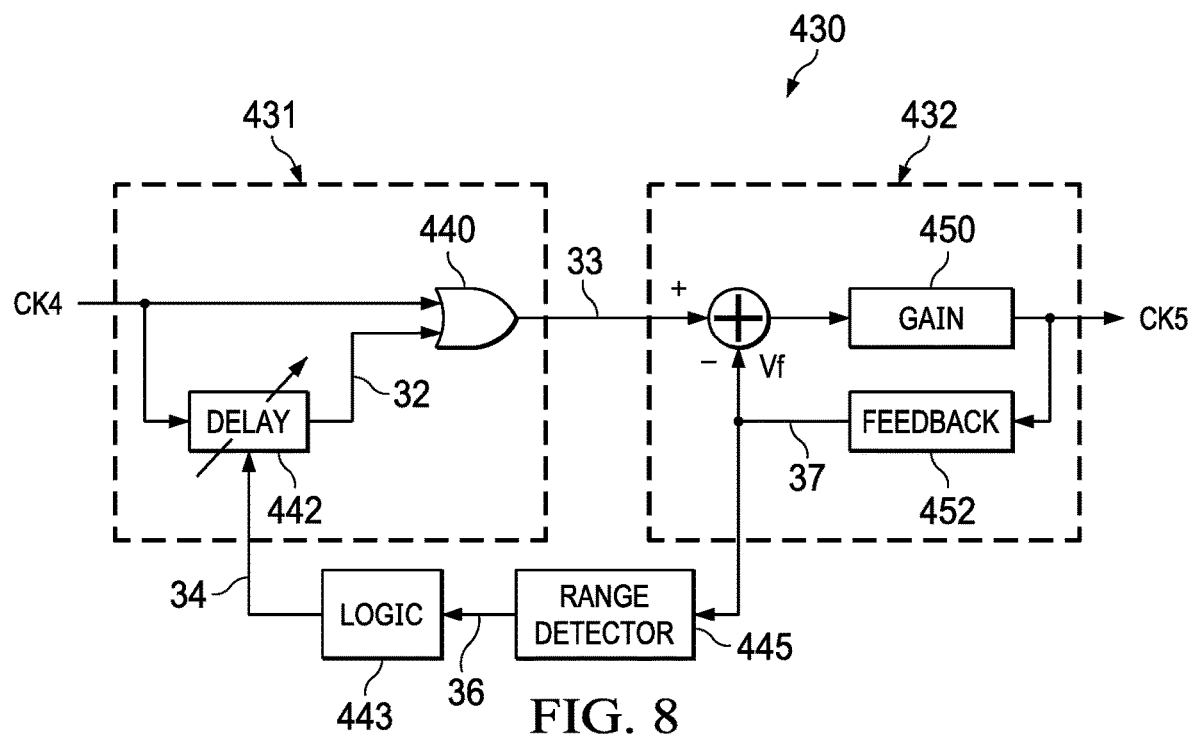
FIG. 8 is a schematic diagram of an illustrative duty cycle corrector (DCC)

Accordingly, we propose a novel implementation as shown in FIG. 8. DCC 430 is formed from two parts: a coarse calibration section 431 and a fine calibration section 432. The coarse calibration section 431 receives an input signal CK4 and performs larger, digitally-controlled adjustments in the duty cycle of the signal, albeit with a larger error range than the fine calibration section 432. The fine calibration section 432 receives the digitally-calibrated output signal 33 from the coarse calibration section 431, and employ analog feedback for fine-tuning the duty cycle of the signal 33 closer to the target duty cycle. While the range of the fine-tuning achievable by the fine calibration section is limited by the finite gain of the analog feedback loop, the two sections can cooperate to cover a larger range of duty cycle corrections.

The coarse calibration section 431 comprises a digital controlled delay 442, an OR gate 440 for duty cycle extension, a range detector 445 to detect the error of the fine calibration section 432, and a logic circuit 443 for digital control code generation. The digital controlled delay 442 may be implemented in accordance with methods well-known to those familiar with the art. One implementation of the digital controlled delay 442 is a chain of inverter gates connected in series, where the number of the inverter gates inserted in the path of the input signal are adjusted to provide a corresponding delay. It may also be done by controlling the supply voltage on the inverter chain the alter the delay via a digital control signal. There are many methods to implement a controllable delay chain and the scope of this patent is not limited to a single implementation of this block.

Figure 9:
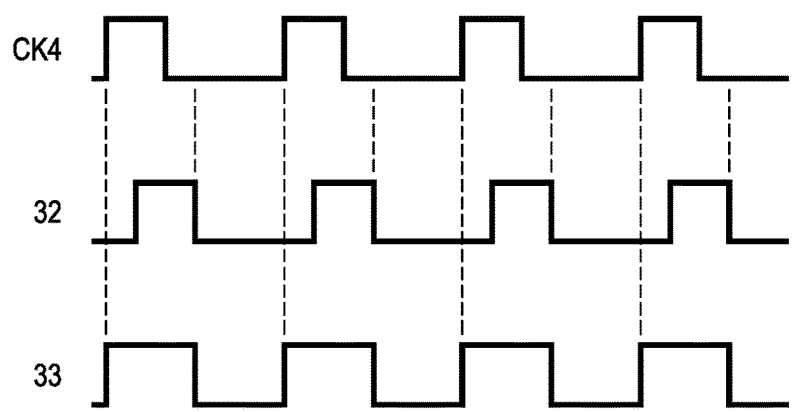
FIG. 9 is a set of waveforms for the illustrative DCC in FIG. 8.

The operation of coarse calibration section 431 is now described with respect to FIG. 9. In this example, the duty cycle of input signal CK4 is less than 50%, but greater than 25%, e.g., the clock signal is asserted high for between 25% and 50% of the signal period. (Where this is not the case, the input signal may be inverted and or otherwise processed to achieve this condition.) The delayed signal 32 is shown as a waveform that has been delayed by a selected amount of time by the digitally controlled delay circuit 442. The calibrated output signal 33 is the result of the OR operation of the input signal CK4 and the delayed signal 32. The digital delay is set to place the falling edge of the delayed signal 32 approximately one half period after the rising edge of the input signal CK4, thus producing a duty cycle close to 50%.

The fine calibration section 432 comprises a gain circuit 450 and a feedback circuit 452. The gain circuit 450 and the feedback circuit 452 may be implemented in accordance with methods well-known to those familiar with the art. See, e.g., Mahadevan and Pialis, "Duty-cycle correction circuit", U.S. Pat. No. 7,202,722. In one embodiment, the gain circuit 450 comprises a correction amplifier that produces a binary clock output signal CK5, and the feedback circuit 452 includes an operational amplifier using current mirrors for generating a correction voltage Vf 37. The correction voltage Vf 37 is fed back to adjust the effective threshold of the gain circuit 450 in a fashion that increases the duty cycle of the binary clock signal when it is below 50%, and reduces the duty cycle of the binary clock signal when it is above 50%.

The voltage Vf 37 of the illustrated embodiment is designed to be within a predetermined range between Vmin and Vmax. If the voltage Vf 37 is in the range between Vmin and Vmax, the control loop can reduce deviations from the desired 50% duty cycle. But when the voltage Vf 37 is smaller than Vmin, the CK5 duty cycle is larger than 50% and the analog calibration is unable to fully correct the duty cycle error. Similarly, when the voltage Vf 37 is larger than Vmax, the CK5 duty cycle is less than 50% and the analog calibration is unable to fully correct the duty cycle error.

Figure 10:
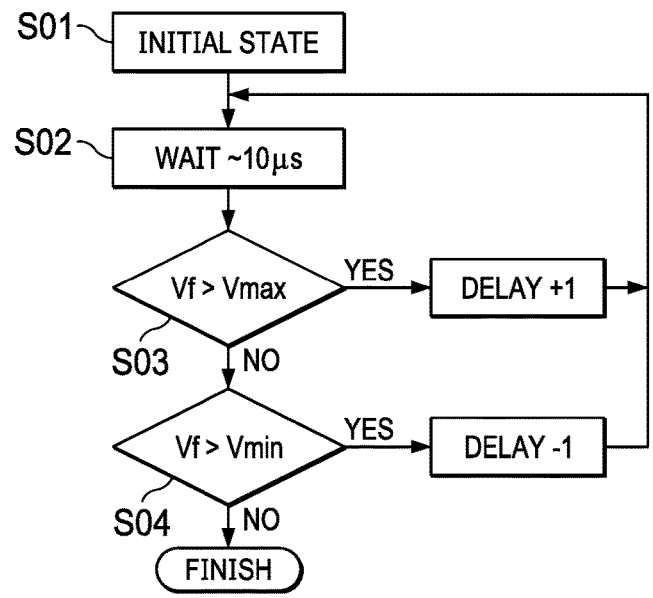
FIG. 10 is a flow diagram of an illustrative duty cycle calibration method.

FIG. 10 is a flow diagram illustrating an example method for calibrating the duty cycle of a signal using the coarse calibration section 431 and a fine calibration section 432 as described herein. The delay is triggered while the analog DCC calibration section is close to its operation boundary. The method begins at step S01, where an input signal CK4 is received. In step S02, the logic circuit 443 controls the range detector 445 to wait enough time to make sure the analog path settled down. In some implementations, the settling delay is set at about 10 μs. Then, in step S03, the logic circuit 443 polls the range detector 445 to collect the voltage level of correction voltage Vf 37 and determines if Vf 37 is larger than Vmax. If Vf 37 is larger than Vmax, as above mentioned, the output duty cycle is less than 50% and the analog calibration is unable to fully correct the duty cycle error. In this case, the logic circuit 443 will add 1 to the digital delay code 34 to increase the digitally-controlled delay for the delayed signal 32 relative to input signal CK4, increasing the duty cycle of the coarse-corrected clock signal 33 closer to 50%. Thereafter, the logic circuit 443 returns to step S02 to enable re-settling of the fine calibration section. In step S03, if Vf 37 is not larger than Vmax, the process will go to step S04.

In step S04, the logic circuit 443 determines if Vf 37 is smaller than Vmin. If Vf 37 is smaller than Vmin, which means the output duty cycle is larger than 50% and the analog calibration is unable to fully correct the duty cycle error, the logic circuit 443 will reduces the digital delay code 34 by 1, decreasing the digitally controlled delay of delayed signal 32 relative to input signal CK4 will decrease, and thereby reducing the duty cycle of the coarse-corrected clock signal 33 closer to 50%. Thereafter, the logic circuit 443 controls the DCC 430 return to step S02. Generally, the bandwidth of the coarse calibration loop is much smaller than the analog loop. After several iterations of the illustrative method, the correction voltage Vf 37 will be in the desired range, which means the calibration is complete.

Figure 11:
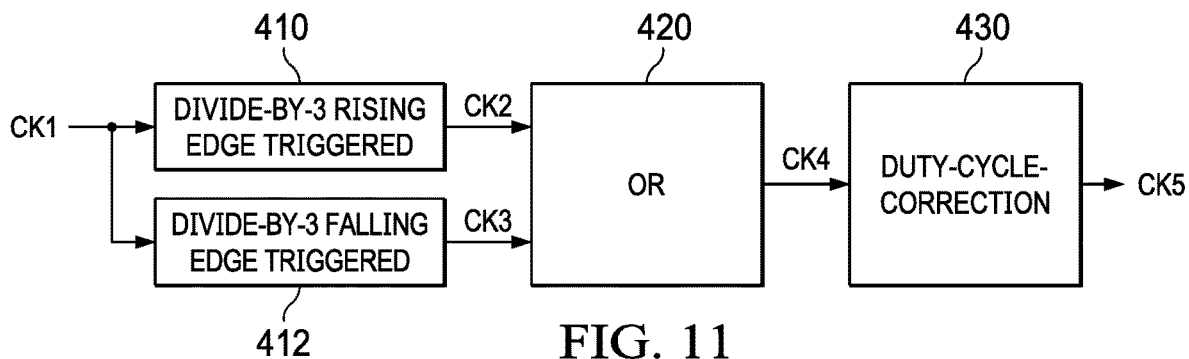
FIG. 11 is a schematic diagram of an alternative divide-by-1.5 divider.

FIG. 11 is a block diagram illustrating an alternative embodiment of a divide-by-1.5 block. The divide-by-3 rising edge triggered block 410, OR gate 420 and duty cycle correction 430 are the same as shown in the corresponding constituents illustrated in FIG. 4. The differences between FIG. 10 and FIG. 4 are that divide-by-3 rising edge triggered block 418 is replaced by a divide-by-3 falling edge triggered block 412, and the differential clock is not required. The clock signal CK1 may be provided directly to both divider blocks 410, 412 to achieve a half-period difference between CK2 and CK3. The combining operation of CK2 and CK3 will produce signal CK4 with a frequency being the frequency of CK1 divided by 1.5. The signal CK4 is processed by DCC 430 such that the duty cycle of the output signal CK5 is 50%.

All of the circuits and methods disclosed and claimed herein can be made and executed without undue experimentation in light of the present disclosure. While the circuits and methods of this disclosure have been described in terms of preferred embodiments, it will be apparent to those of skill in the art that variations may be applied without departing from the scope and intent of the disclosure. Subject to established claim construction principles and the reasonable understanding of one of ordinary skill in the art, all such similar substitutes and modifications apparent to those skilled in the art are deemed to be within the scope of the appended claims.

What is claimed is:

1. An extended-range PLL comprising:
    a feedback divider that produces a feedback clock;
    a phase comparator that determines a phase error between a reference clock and the feedback clock;
    a loop filter that converts the phase error into a control signal;
    a voltage controlled oscillator (VCO) that provides a generated clock signal having a generated clock frequency determined by the control signal;
    a divide-by-1.5 block that produces a reduced-frequency clock signal in response to the generated clock signal; and
    a multiplexer that selects one of the generated clock signal and the reduced-frequency clock signal as a selected clock signal,
    the divide-by-1.5 block including:
        a first divider that produces a first clock signal having a first phase and a first frequency that is one third of the generated clock frequency;
        a second divider that produces a second clock signal having the first frequency and a second phase that is 180° apart from the first phase;
        a combiner that combines the first clock signal with the second clock signal to obtain a combined clock signal having a second frequency that is twice the first frequency; and
        a duty cycle correction circuit that derives the reduced-frequency clock signal from the combined clock signal, the duty-cycle correction circuit having a digital calibration section with:
            a delay element that accepts an input clock and produces a delayed clock with a digitally-controlled delay; and
            a combining block that combines the input clock with the delayed clock to produce a calibrated clock having a duty cycle closer to 50% than the duty cycle of the input clock.

2. The extended-range PLL of claim 1, wherein the combining block includes an OR gate.

3. The extended-range PLL of claim 1, wherein the duty-cycle correction circuit includes an analog calibration section with:
    a correction amplifier that produces the reduced-frequency clock signal in response to the calibrated clock; and
    a feedback amplifier that adjusts an effective threshold for the correction amplifier to adjust a duty cycle of the reduced-frequency clock signal towards 50%.

4. The extended-range PLL of claim 3, wherein the digital calibration section and the analog calibration section both are utilized and are in series.

5. The extended-range PLL of claim 4, wherein the duty cycle correction circuit further comprises a controller that adjusts the digitally-controlled delay when the analog calibration section is unable to fully adjust the duty cycle of the reduced frequency clock signal to 50%.

6. The extended-range PLL of claim 1, wherein the feedback divider derives the feedback clock directly from the generated clock signal.

7. An extended-range PLL comprising:
    a feedback divider that produces a feedback clock;
    a phase comparator that determines a phase error between a reference clock and the feedback clock;
    a loop filter that converts the phase error into a control signal;
    a voltage controlled oscillator (VCO) that provides a generated clock signal having a generated clock frequency determined by the control signal;
    a divide-by-1.5 block that produces a reduced-frequency clock signal in response to the generated clock signal; and
    a multiplexer that selects one of the generated clock signal and the reduced-frequency clock signal as a selected clock signal,
    wherein the feedback divider produces the feedback clock in response to the selected clock signal.

8. The extended-range PLL of claim 7, further comprising:
    a post-divider that converts the generated clock signal into an output clock signal having an output clock frequency that is 1/M of a frequency of the selected clock signal, M being a selectable positive integer.

9. The extended-range PLL of claim 8, wherein selectable values of M consist only of powers of two.

10. A clock generation method comprising:
    determining a phase error between a reference clock and a feedback clock;
    filtering the phase error to yield a control signal;

using a voltage-controlled oscillator (VCO) to provide a generated clock signal having a generated clock frequency determined by the control signal;

deriving a reduced-frequency clock signal from the generated clock signal with a divide-by-1.5 block;

multiplexing a selected one of the generated clock signal and the reduced-frequency clock signal onto a selected clock signal line; and producing the feedback clock by dividing down a frequency of the selected one of the generated clock signal and the reduced-frequency clock signal.

11. The clock generation method of claim 10, wherein said deriving includes:

producing a first clock signal having a first phase and a first frequency that is one third of the generated clock frequency;

producing a second clock signal having the first frequency and a second phase that is 180° apart from the first phase; and combining the first clock signal with the second clock signal to obtain a combined clock signal having a second frequency that is twice the first frequency.

12. The clock generation method of claim 11, wherein said deriving further includes adjusting the combined clock signal to have a 50% duty cycle.

13. The clock generation method of claim 12, wherein said adjusting includes at least one of:

performing a digital calibration on the combined clock signal to produce a coarsely-calibrated clock; and performing an analog calibration on the coarsely-calibrated clock to achieve a 50% duty cycle in the reduced-frequency clock signal.

14. The clock generation method of claim 13, wherein said adjusting further includes:

modifying the digital calibration when the analog calibration is unable to fully achieve the 50% duty cycle.

15. A divide-by-1.5 circuit that comprises:

a first divider that produces a first clock signal having a first phase and a first frequency that is one third of an input clock frequency;

a second divider that produces a second clock signal having the first frequency and a second phase that is 180° apart from the first phase; and a combiner that combines the first clock signal with the second clock signal to obtain a combined clock signal having a second frequency that is twice the first frequency; and a duty cycle correction circuit that derives the reduced-frequency clock signal from the combined clock signal, the duty-cycle correction circuit having a digital calibration section with:

a delay element that accepts the combined clock signal and produces a delayed clock signal with a digitally-controlled delay; and a combining block that combines the combined clock signal with the delayed clock signal to produce a calibrated clock signal having a duty cycle closer to 50% than the duty cycle of the combined clock signal.

16. The divide-by-1.5 circuit of claim 15, wherein the duty-cycle correction circuit includes an analog calibration section with:

a correction amplifier that produces the reduced-frequency clock signal in response to the calibrated clock signal; and a feedback amplifier that adjusts an effective threshold for the correction amplifier to adjust a duty cycle of the reduced-frequency clock signal towards 50%.

17. The divide-by-1.5 circuit of claim 16, wherein the duty cycle correction circuit further comprises a controller that adjusts the digitally-controlled delay when the analog calibration section is unable to fully adjust the duty cycle of the reduced frequency clock signal to 50%.

18. The divide-by-1.5 circuit of claim 16, wherein the digital calibration section and the analog calibration section are in series.

* * * * *